United States Patent
Ichikawa et al.

(10) Patent No.: US 7,407,386 B2
(45) Date of Patent: Aug. 5, 2008

(54) WIRED CIRCUIT BOARD AND PRODUCTION METHOD THEREOF

(75) Inventors: Kazushi Ichikawa, Osaka (JP); Yuichi Takayoshi, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 11/705,408

(22) Filed: Feb. 13, 2007

(65) Prior Publication Data
US 2007/0190852 A1    Aug. 16, 2007

(30) Foreign Application Priority Data
Feb. 14, 2006    (JP)    ............................. 2006-036727

(51) Int. Cl.
*H01R 12/00*    (2006.01)
(52) U.S. Cl. ........................................................ 439/55
(58) Field of Classification Search .................. 439/55, 439/65
See application file for complete search history.

(56) References Cited

U.S. PATENT DOCUMENTS

| | | |
|---|---|---|
| 2002/0043704 A1 | 4/2002 | Seko |
| 2005/0001299 A1 | 1/2005 | Ryu et al. |
| 2005/0218513 A1 | 10/2005 | Seko |

FOREIGN PATENT DOCUMENTS

| | | |
|---|---|---|
| EP | 1 691 589 A1 | 8/2006 |
| JP | 2005-175113 | 6/2005 |

*Primary Examiner*—Khiem Nguyen
(74) *Attorney, Agent, or Firm*—Jean C. Edwards, Esq.; Akerman Senterfitt

(57) ABSTRACT

A wired circuit board includes an insulating base layer, a conductive pattern formed on the insulating base layer, and an insulating cover layer formed on the insulating base layer for covering the conductive pattern. The conductive pattern includes terminal portions for connecting with external terminals. The insulating cover layer has an opening formed correspondingly for the respective terminal portions. A position determining zone for determining whether or not a margin of the insulating cover layer facing the opening is located in a proper position is provided in proximity of the terminal portions.

5 Claims, 14 Drawing Sheets

FIG. 1
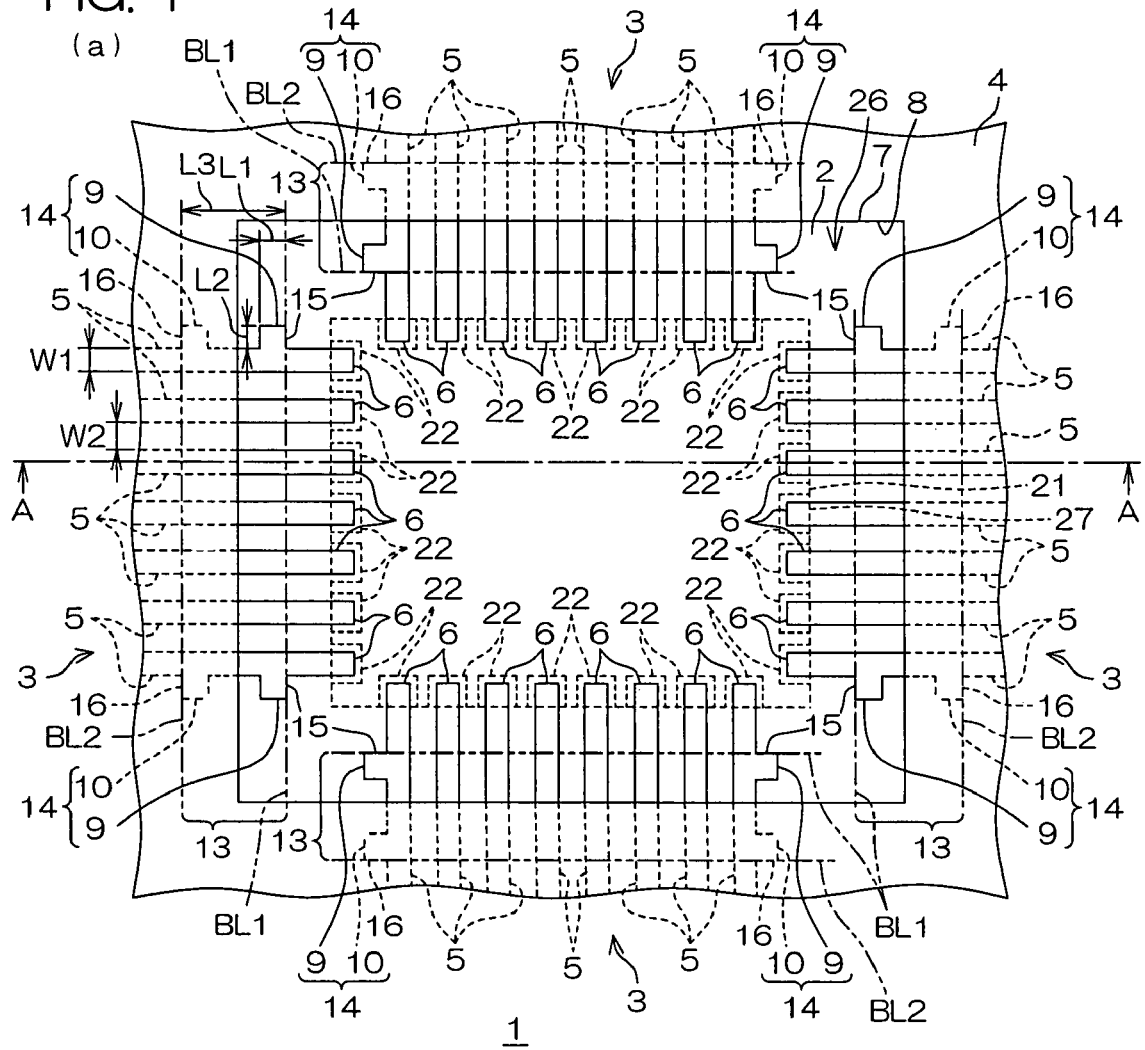
(a)
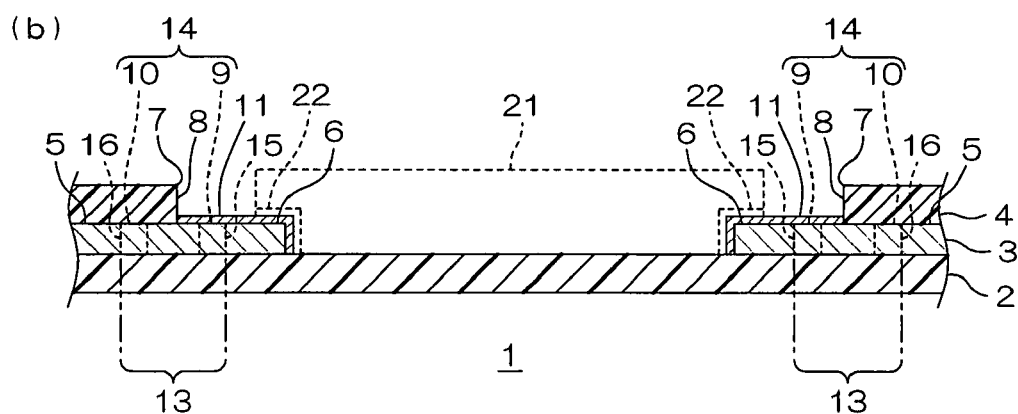
(b)

FIG. 2
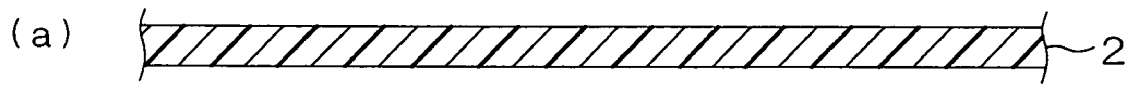
(a)
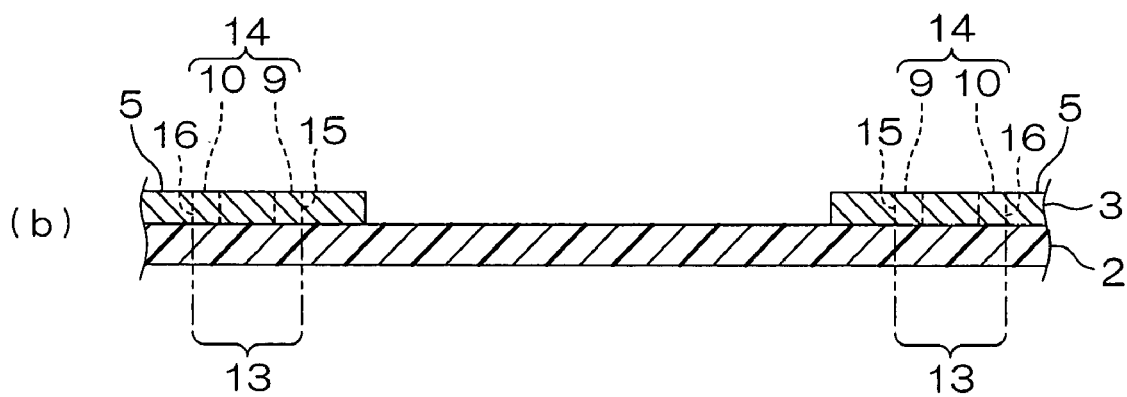
(b)
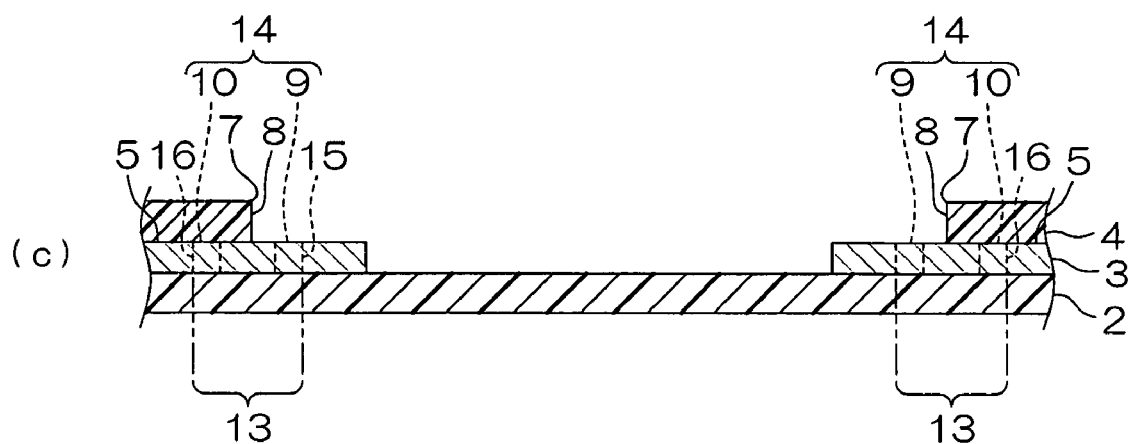
(c)
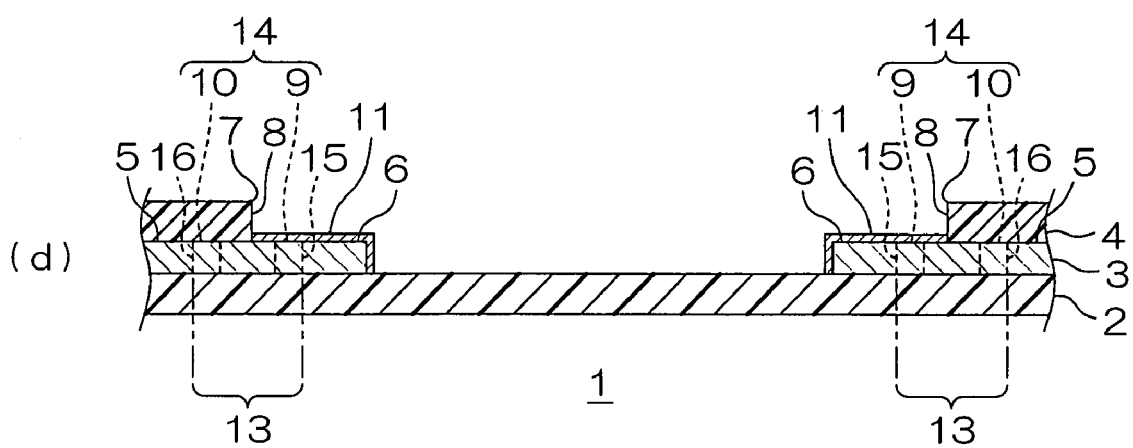
(d)

WIRED CIRCUIT BOARD AND PRODUCTION METHOD THEREOF

CROSS REFERENCE TO RELATED APPLICATION

This application is an application claiming priority based on Japanese Patent Application No. 2006-36727 filed on Feb. 14, 2006, the disclosure of which is incorporated herein by reference.

BACKGROUND OF THE INVENTION

1. Field of the Invention

The present invention relates to a wired circuit board and to a production method thereof. More particularly, the present invention relates to a wired circuit board having terminals connected to external terminals and to a production method of the same.

2. Description of the Prior Art

The wired circuit board commonly comprises a conductive pattern comprising a plurality of wires formed on an insulating base layer, and an insulating cover layer formed on the insulating base layer for covering the conductive pattern.

In this wired circuit board, the conductive pattern has terminal portions for connecting to external terminals of an electronic component and the like, and the insulating cover layer has an opening formed correspondingly for the terminal portions. The terminal portions are exposed from the opening for connecting with the external terminals.

For example, a flip-chip-mounting printed circuit board comprising a board body forming a board conductor thereon, and an insulating protection film formed on the board body and having an opening at a location where an IC chip is mounted has been proposed as the wired circuit board, wherein a connection conductor portion of the board conductor is exposed from the opening so that it can connect with electrodes of the IC chip (Cf. Japanese Unexamined Patent Publication No. 2005-175113, for example).

In this wired circuit board, relative arrangement between the terminal portions and the opening, and a dimension of the opening are critical for the reliable connection between the terminal portions and the external terminals.

Several methods for forming the opening in the insulating cover layer are known: a first method of a photo processing method using a photo mask via which a photosensitive resin is exposed to light and developed to form the opening in the insulating cover layer; a second method of a printing method using a solder resist for forming the opening in the insulating cover layer; and a third method that an insulating resin film having an opening previously formed is adhesively bonded to form the insulating cover layer, or after an insulating resin film having no opening is adhesively bonded via an adhesive to form the insulating cover layer, an opening is formed in the insulating cover layer.

However, any of the first to third methods outlined above has a possible problem that an actual position of the opening formed may be displaced from a designed position of the opening.

Specifically, the first method has a possible problem that due to possible displacement of the photo mask in the photo process, the actual position of the opening formed may be displaced from the designed position of the opening. The second method has a possible problem that due to possible pattern misalignment that may be caused by displacement of the solder resist in the printing process, the actual position of the opening formed may be displaced from the designed position of the opening, or an actual dimension of the opening formed is deviated from the designed dimension of the opening. Further, the third method involves possible problems that the insulating resin film having the opening previously formed may be adhesively bonded with the opening displaced from the designed position, that the insulating resin film may be bored after bonding at a position displaced from the designed position of the opening of the insulating resin film, and that the opening may be bored with its actual dimension deviated from the designed dimension of the opening.

If the actual position of the opening formed is displaced from the designed position of the opening, then the terminal portions are covered with the insulating cover layer, in other words, is exposed so insufficiently that an electronic component cannot be mounted, so that it causes difficulties in mounting the electronic component reliably. Accordingly, in the production method of this wired circuit board, determination must be made whether or not the actual position of the opening formed in the insulating cover layer is displaced from the designed position of the opening. If the actual position of the opening formed in the insulating cover layer is determined displaced from the designed position of the opening, the wired circuit board must be removed as a defective product.

The displacement of the relative position between the terminal portions and the opening, and the dimensional deviation of the opening formed can be determined by actual measurement using a microscope, for example, which is known as a method for determining whether or not the actual position of the opening formed in the insulating cover layer is displaced from the designed position of the opening.

However, this known measuring method takes a lot of troubles with the determination of the displacement, and thus have difficulties in realizing cost reduction while ensuring high productivity.

SUMMARY OF THE INVENTION

It is an object of the present invention to provide a wired circuit board that can realize cost reduction by determining defectiveness in a simple and reliable manner, while ensuring high productivity, and a production method of the same.

The present invention provides a wired circuit board comprising an insulating base layer, a conductive pattern formed on the insulating base layer, and an insulating cover layer formed on the insulating base layer for covering the conductive pattern, wherein the conductive pattern includes terminal portions for connecting with external terminals, the insulating cover layer has an opening formed correspondingly for the respective terminal portions, and a position determining zone for determining whether or not a margin of the insulating cover layer facing the opening is located in a proper position is provided in proximity of the terminal portions.

In the wired circuit board of the present invention, the position determining zone for determining whether or not the margin of the insulating cover layer facing the opening is located in a proper position is provided in proximity of the terminal portions. This can allow easy determination whether or not the margin of the insulating cover layer is located in a proper position by reference to the position determining zone and thus can allow easy determination whether or not the actual position of the opening of the insulating cover layer formed is displaced from the designed position of the opening. By virtue of this, a wired circuit board can be provided that can realize cost reduction by determining defectiveness of the wired circuit board in a reliable and simple manner, while ensuring high productivity.

In the wired circuit board of the present invention, it is preferable that the position determining zone is formed to extend along a direction of the margin of the insulating cover layer, and the position determining zone is defined by a pair of determining marks which are disposed opposite to each other in a direction intersecting with the direction along the margin of the insulating cover layer and are spaced apart by an amount to allow tolerance to an area where the margin of the insulating cover layer is formed.

In the wired circuit board of the present invention, it is preferable that a plurality of terminal portions are arranged in parallel along the direction of the margin of the insulating cover layer, the conductive pattern includes wires extending from the terminal portions in the direction intersecting with the direction along the margin of the insulating cover layer correspondingly to the respective terminal portions, and that the determining marks are located outside of the wires arranged at outermost sides of the direction extending along the margin of the insulating cover layer.

In the wired circuit board of the present invention, it is preferable that the determining marks are projected outward from the wires arranged at both outermost sides of the direction extending along the margin of the insulating cover layer.

The present invention provides a production method of a wired circuit board, comprising the steps of forming a conductive pattern including terminal portions for connecting with external terminals on an insulating base layer, forming an insulating cover layer on the insulating base layer to cover the conductive pattern so that an insulating cover layer is formed with an opening from which the terminal portions are exposed, forming a position determining zone for determining whether or not a margin of the insulating cover layer facing the opening is located in a proper position, and determining whether or not the margin of the insulating cover layer is located in a proper position, wherein in the step of determining whether or not the margin of the insulating cover layer is located in a proper position, when the margin of the insulating cover layer is within the position determining zone, the wired circuit board is determined to be defective, while when the margin of the insulating cover layer is out of the position determining zone, the wired circuit board is determined to be defective.

In the production method of the wired circuit board of the present invention, when the margin of the insulating cover layer is situated in the position determining zone, the wired circuit board is determined as non-defective, while on the other hand, when the margin of the insulating cover layer is not situated in the position determining zone, the wired circuit board is determined as defective. This configuration can provide easy determination whether or not the actual position of the opening of the insulating cover layer is displaced from the designed position of the opening by reference to the position determining zone, and, whereby easy determination can be made on the defective/non-defective of the wired circuit board. As a result, this can provide a wired circuit board that can realize cost reduction by determining defectiveness of the wired circuit in a reliable and simple manner, while ensuring high productivity.

In the production method of the wired circuit board of the present invention, it is preferable that in the steps of forming the conductive pattern and forming the position determining zone, the conductive pattern and the position determining zone are formed simultaneously.

BRIEF DESCRIPTION OF THE DRAWINGS

In the drawings:

FIG. 1(a) is an enlarged plan view showing a mounting area of an embodiment of a wired circuit board of the present invention (in the state that terminal portions of an insulating cover layer are placed in position determining zone), and FIG. 1(b) is an enlarged sectional view of the mounting area of the wired circuit board taken along line A-A shown in FIG. 1(a), FIG. 2 is a production process drawing showing a producing method of the wired circuit board shown in FIG. 1(b), (a) showing the process of preparing an insulating base layer, (b) showing the process of forming both a conductive pattern and determining mark simultaneously on the insulating base layer, (c) showing the process of forming an insulating cover layer on the insulating base layer so that an insulating cover layer is formed with an opening in the insulating cover layer, and (d) showing the process of forming a metal plating layer on terminal portions exposed from the opening of the insulating cover layer, on their respective wires, and on each pair of determining marks.

DETAILED DESCRIPTION OF THE PREFERRED EMBODIMENTS

Figure 3:
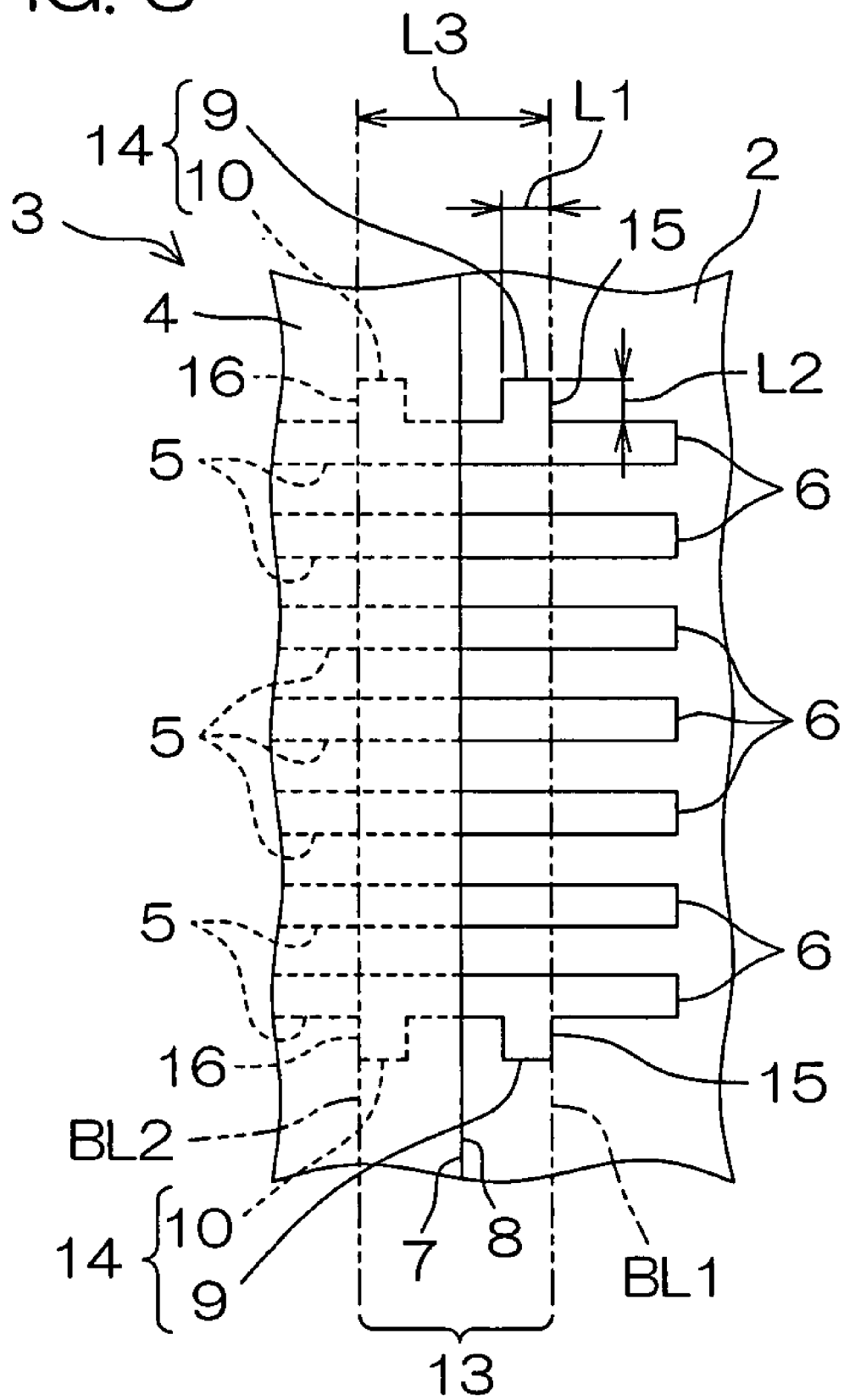
FIG. 3 is an enlarged plan view of a marginal portion of the insulating cover layer on a side of the opening in the wired circuit board shown in FIG. 1(a)

FIG. 1(a) is an enlarged plan view showing a mounting area of a wired circuit board of an embodiment of the present invention. FIG. 1(b) is an enlarged sectional view of the mounting area of the wired circuit board taken along line A-A shown in FIG. 1(a).

The wired circuit board 1 is, for example, a flexible wired circuit board extending in a generally rectangular strip form, as viewed from top, though not shown. This wired circuit board 1 includes, at both end portion thereof, a mounting area 26 shown in FIG. 1(a). A mounting portion 27 in a generally rectangular form, as viewed from top, for mounting an electronic component 21 is provided in each the mounting area 26.

Further, the wired circuit board 1 includes an insulating base layer 2, a conductive pattern 3 formed on the insulating base layer 2, and an insulating cover layer 4 formed on the insulating base layer 2 for covering the conductive pattern 3, as shown in FIG. 1(b).

The insulating base layer 2 is formed in a generally rectangular strip form to define, for example, an outline of the wired circuit board 1, though not shown.

The conductive pattern 3 in each mounting area 26 integrally includes a plurality of terminal portions 6 to connect with external terminals 22 of the electronic component 21, and a plurality of wires 5 arranged correspondingly for the respective terminal portions 6, as shown in FIG. 1(a).

A plurality of the terminal portions 6 are disposed opposite to the external terminals 22 of the electronic component 21 to face the margin on each side (four sides) of a mounting portion 27. The respective terminal portions 6 are arranged in parallel with spaced apart from each other at a spaced interval to extend in a direction orthogonal to a direction along each side of the mounting portion 27.

The respective wires 5 are arranged in parallel with spaced apart from each other at a spaced interval to corresponding to the respective terminals portions 6. The wires 5 on each side of the mounting portion 27 extend from the respective terminal portions 6 in a direction orthogonal to a direction along the margin 7 of the insulating cover layer 4. A width W1 of each wires 5 is set to the range of e.g. 5-500 µm, and a space W2 between adjacent wires is set to the range of e.g. 5-500 µm.

Each the terminal portions 6 formed in each mounting area 26 provided at both end of the wired circuit board 1 are connected via the corresponding wires 5, which is not shown.

The insulating cover layer 4 is formed on the insulating base layer 2 to cover the wires 5, and an opening 8 is formed to correspond to the each mounting area 26. Each opening 8 is opened in a generally rectangular form, as viewed from top, similar in shape to and slightly larger than the mounting portion 27 to surround the mounting portion 27. The margin 7 on each side of the opening 8 is orthogonal to the wires 5 extending in parallel from the each side of the mounting portion 27.

This wired circuit board 1 has determining marks 14 in the each mounting area 26.

As shown in FIG. 1(a) and FIG. 3, the determining marks 14 are formed on each side of the opening 8 and arranged as a pair at the outside of the wires 5 at both outer sides (outermost sides) of the direction along the margin 7 of the insulating cover layer 4.

The pair of determining marks 14 is disposed opposite to each other in the respective wires 5 at the outermost sides along a longitudinal direction thereof and are spaced apart by an amount to allow tolerance to a location where the margin 7 of the insulating cover layer 4 is formed.

To be more specific, the pair of determining marks 14, which are provided in the respective wires 5 located at the outermost sides, are formed with a first protrusion 9 located closer to the corresponding terminal portions 6 and a second protrusion 10 located farther therefrom.

The first protrusion 9 and the second protrusion 10 are both formed in a generally rectangular form, as viewed from top, projecting continuously from the two wires 5 on the outermost sides.

The first protrusion 9 and the second protrusion 10 have a length L1 along the longitudinal direction of the wire 5 and set to the range of e.g. 15-150 µm, or preferably 20-100 µm, and a length L2 along the direction of the margin 7 of the insulating cover layer 4 and set to the range of e.g. 15-150 µm, or preferably 20-100 µm. If they have larger lengths, then the locations therefore is limited. On the other hand, if they have smaller lengths, then it causes difficulties in observation.

The pair of determining marks 14 are provided on each side of the opening 8 to correspond to the wires 5 at the outermost sides. A position determining zone 13 on each side of the opening 8 is defined by these determining marks 14 (i.e., two of the first protrusion 9 and two of the second protrusion 10).

Specifically, respective (four) position determining zones 13 are formed corresponding to the respective sides of the opening 8. Each position determining zone 13 is defined as a strip-shaped zone along the margin 7 on each side of the opening 8 and sandwiched between a first reference line BL1 connecting between two inner margins 15 of the two first protrusions 9 (on the terminal portion 6 side of the longitudinal direction of the wires 5) and a second reference line BL2 connecting between two outer margins 16 of the two second protrusions 10 (on the side opposite to the terminal portion 6 side of the longitudinal direction of the wires 5).

In each position determining zone 13, the inner margin 15 of each first protrusion 9 and the outer margin 16 of each second protrusion 10 are spaced apart at a spaced interval (a width L3 of the position determining zone 13) to allow tolerance to a location where the margin 7 of the insulating cover layer 4 is formed, as mentioned above.

This can provide the result that when the margin 7 on each side of the opening 8 is entirely situated in between the first reference line BL1 and the second reference line BL2 on the each side of the opening 8, as shown in FIG. 1(a), the margin 7 of the insulating cover layer 4 can be determined to be located in a proper position on the each side, from which it can be detected that the actual position of the opening 8 formed is within the designed position (including the tolerance).

Figure 14:
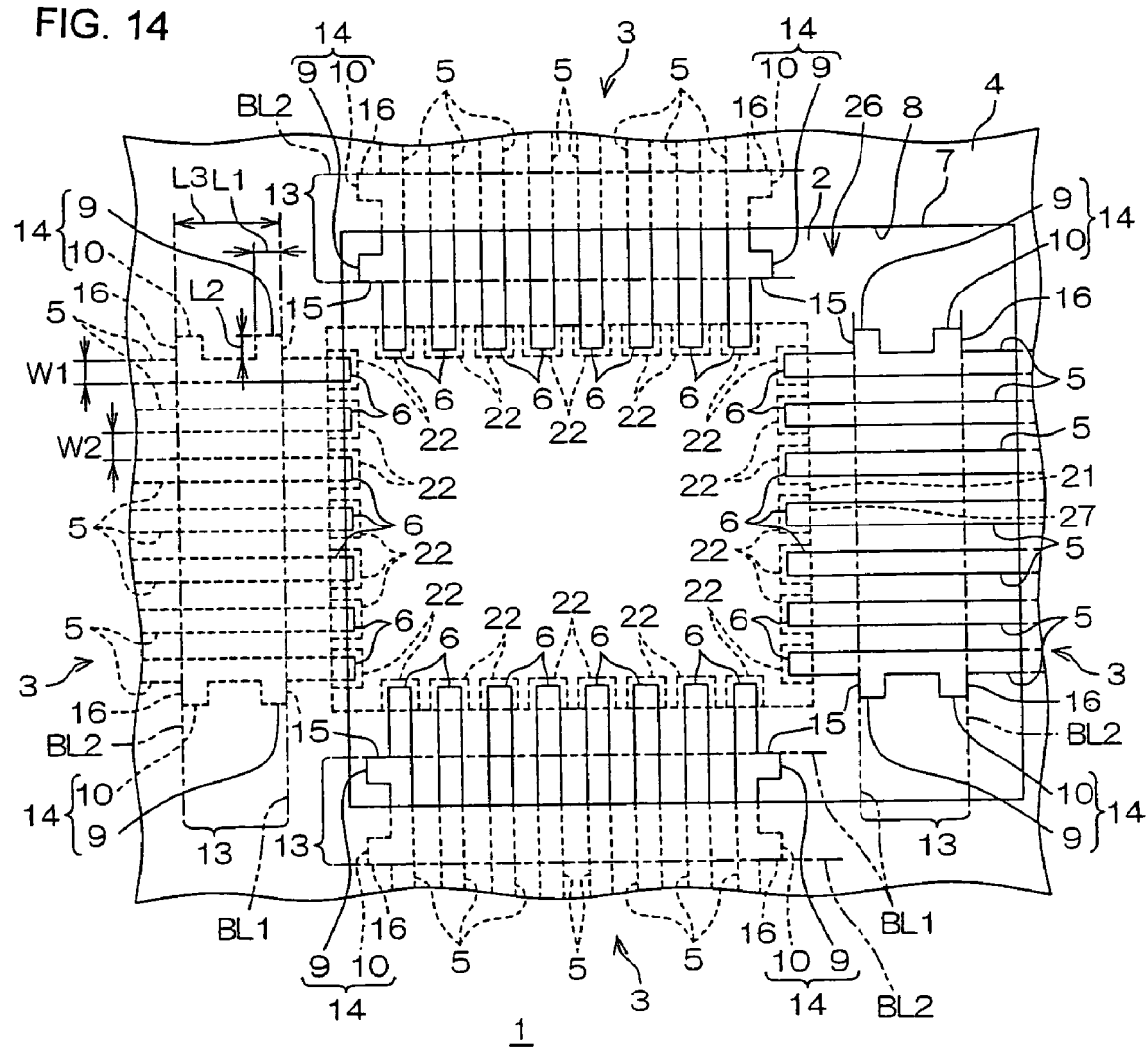
FIG. 14 is an enlarged plan view showing the mounting area of the embodiment of the wired circuit board shown in FIG. 1(a) (in the state that margins of the insulating cover layer are not placed in the position determining zone).

On the other hand, when the margin 7 of the insulating layer 4 is not situated between the first reference line BL1 and the second reference line BL2 on at least any side of the opening 8, the opening 8 formed is displaced as a whole, for example, toward the right-hand side of the drawing from the designed position of the opening 8, as shown in FIG. 14. As a result, the margin 7 of the insulating cover layer 4 crosses over the second reference line BL2 of the position determining zone 13 on the right-hand side of the drawing, and the margin 7 of the insulating cover layer 4 crosses over the first reference line BL1 of the position determining zone 13 on the left-hand side of the drawing. In this case, the margin 7 of the insulating cover layer 4 can be determined not to be located in its proper position, from which it can be detected that the actual position of the opening 8 is not within the designated position (include the tolerance).

A length between the first reference line BL1 and the second reference line BL2 on each side of the opening 8 (i.e., a width L3 of the position determining zone 13 taken as a tolerance zone) is in the range of e.g. 100-300 μm, or preferably 150-200 μm.

In this wired circuit board 1, a metal plating layer 11 is laminated on the respective terminal portions 6, respective wires 5, and respective determining marks 14 (usually the first protrusions 9 only) exposed from the opening 8 in the each mounting area 26.

Now, a producing method of this wired circuit board 1 is explained with reference to FIG. 2.

In this method, the insulating base layer 2 is prepared, first, as shown in FIG. 2(a). For example, synthetic resins in a film form, such as polyimide resin, polyamide imide resin, acrylic resin, polyether nitrile resin, polyether sulfonic resin, polyethylene terephthalate resin, polyethylene naphthalate resin, and polyvinyl chloride resin, are used for the insulating base layer 2. A polyimide resin film is preferably used for the insulating base layer 2.

The insulating base layer 2 may be prepared as a previously formed synthetic resin film, or may be prepared by the process that a varnish of a synthetic resin is coated over a stripping sheet, which is not shown, by casting to form a film, first, and then, the film is dried and, cured if necessary. Further, the insulating base layer 2 may be prepared by the process that after a varnish of a photosensitive synthetic resin is coated over the stripping sheet by casting to form a film, the film is dried, first, and then the resulting film is exposed to light and developed to be formed into a predetermined pattern and, cured if necessary. The insulating base layer 2 has a thickness of e.g. 5-50 μm.

Then, both the conductive pattern 3 and the pair of respective determining marks 14 are formed on the insulating base layer 2 simultaneously, as shown in FIG. 2(b). Metals foils including, for example, copper, nickel, gold, solder, or alloys thereof may be used for the conductive pattern 3 and the pair of respective determining marks 14. Copper foil is preferably used in terms of electrical conductivity, inexpensiveness, and workability.

The conductive pattern 3 and the pair of respective determining marks 14 are formed on the insulating base layer 2 by a known patterning process, such as a subtractive process and an additive process. Specifically, the conductive pattern 3 is formed in a predetermined pattern comprising a plurality of the terminal portions 6 and a plurality of the wires 5, while the pair of respective determining marks 14, corresponding to each side of the mounting portion 27 are also formed in a pattern protruding outward from the both outermost wires.

In the subtractive process, a metal foil is laminated on the entire surface of the insulating base layer 2, first, via an adhesive layer, if desired. Then, an etching resist is formed on a surface of the metal foil in the same pattern to the conductive pattern 3 and the pair of respective determining marks 14. The etching resist is formed by a known method using a dry film resist and the like. Then, after the metal foil exposed from the etching resist is etched, the etching resist is removed by etching or by stripping. Alternatively, the conductive pattern 3 and the pair of respective determining marks 14 may be formed on the insulating base layer 2 simultaneously by the process that a two-layer base material comprising a metal foil laminated on the insulating base layer 2 is prepared and then the metal foil of the two-layer base material is etched.

In the additive process, a thin metal film to be a seed film is formed on the entire surface of the insulating base layer 2, first. The thin metal film is formed from chromium, nickel, copper, or alloys thereof by a thin metal film forming process such as a sputtering process. Subsequently, a plating resist is formed on a surface of the thin metal film in a reverse pattern to the conductive pattern 3 and the pair of respective determining marks 14. The plating resist is formed by a known process using a dry film photoresist and the like by exposure to light and development. Thereafter, the conductive pattern 3 and the pair of respective determining marks 14 are formed simultaneously on a surface of the insulating base layer 2 exposed from the plating resist. The conductive pattern 3 and the pair of respective determining marks 14 are formed, for example, by electrolytic plating, or preferably electrolytic copper plating. In the electrolytic plating, electric power can be fed to the conductive pattern 3 and the pair of respective determining marks 14 from common plating leads with the wires 5 to form the pair of respective determining marks 14, because the pair of respective determining marks 14 are continuous with the wires 5 at the both outermost sides corresponding to each side of the mounting portion 27. Then, after the plating resist is removed by etching or by stripping, the thin metal film exposed from the conductive pattern 3 and the pair of determining marks 14 is removed by etching.

As a result, the conductive pattern 3 comprising the terminal portions 6 and the wires 5 corresponding thereto, and the pair of respective determining marks 14 are formed simultaneously, as shown in FIG. 1(a). This can produce the result that the each position determining zone 13 defined by the both outer position determining marks 14 corresponding to each side of the mounting portion 27 are also formed simultaneously together with the conductive pattern 3 and the pair of respective determining marks 14. The conductive pattern 3 and the pair of respective determining marks 14 have a thickness of e.g. 3-50 μm.

Then, the insulating cover layer 4 is formed on the insulating base layer 2 so that the insulating cover layer 4 is formed with the opening 8 from which the mounting portion 27 is exposed is formed, as shown in FIG. 2(c).

The insulating cover layer 4 is formed, for example, by a known printing method using a solder resist so that the insulating cover layer 4 is formed with the opening 8. Specifically, a known solder resist, such as an epoxy solder resist, an acrylic solder resist, and a urethane solder resist, is coated over the insulating base layer 2 including the conductive pattern 3 so that the insulating cover layer 4 is formed with the opening 8 by a known printing method and thereafter, the coated solder resist is cured, whereby the insulating cover layer 4 is formed.

Alternatively, the insulating cover layer 4 can be formed by a known photo process comprising an exposure-to-light process and a development process. Specifically, a varnish of photosensitive synthetic resin is cast over the insulating base layer 2 including the conductive pattern 3 to form a coating, thereafter, the coating is dried to form a film. Then, the film thus formed is exposed to light via a photo-mask and then developed, whereby the film is patterned so that the insulating cover layer 4 is formed with the opening 8. Thereafter, the film is cured to form the insulating cover layer 4. The same varnish of the photosensitive synthetic resin as that used for the formation of the insulating base layer 2 is also used for the formation of the insulating cover layer 4. Preferably, the varnish of photosensitive polyamic acid resin is used.

Further, the insulating cover layer 4 can be formed by another process. Specifically, a synthetic resin film (preferably, polyimide resin) in which the opening 8 is previously formed such as by punching is prepared and then, the film is adhesively bonded to the insulating base layer 2 including the conductive pattern 3 via an adhesive, whereby the insulating cover layer 4 is formed. Alternatively, after a synthetic resin film (preferably, polyimide resin) is adhesively bonded to the insulating base layer 2 including the conductive pattern 3 via an adhesive, the opening 8 is formed in that film by drilling, laser processing, or etching, whereby the insulating cover layer 4 is formed. For example, epoxy adhesive, acrylic adhesive, and the like are used as the adhesive, and the adhesive layer formed by the adhesive has a thickness of e.g. 5-30 µm.

The insulating cover layer 4 thus formed has a thickness of e.g. 3-30 µm.

Then, a metal plating layer 11 is formed on the respective terminal portions 6, wires 5, and pair of determining marks 14 exposed from the opening 8 of the insulating cover layer 4, as shown in FIG. 2(d). Metals, such as, for example, gold and nickel, are used for the metal plating layer 11. The metal plating layer 11 is formed by electroless plating or by electrolytic plating, for example. Preferably, a nickel plating layer and a gold plating layer are laminated in sequence. This metal plating layer 11 has a thickness of e.g. 0.1-1 µm for the gold plating layer, and a thickness of e.g. 0.5-5 µm for the nickel plating layer.

Then, it is determined whether or not the margin 7 of the insulating cover layer 4 is located in a proper position by reference to the position determining zone 13, as shown in FIG. 1(a).

This determination whether or not the margin 7 of the insulating cover layer 4 is located in a proper position is made by observation using an optical microscope (of e.g. 20-40 magnifications), for example.

For example, in the case of the insulating cover layer 4 formed of the above-mentioned the solder resist, when the coated solder resist is displaced (to an excessive extent over the tolerance to the location where the margin 7 of the insulating cover layer 4 is formed), the margin 7 of the insulating cover layer 4 is not situated in the position determining zone 13 on at least any of the four sides of the opening 8, as shown in FIG. 15. In the case of the insulating cover layer 4 formed by the photo process comprising the process of exposing the photosensitive resin to light and the process of developing it, when the photo-mask is displaced (to an excessive extent over the tolerance to the location where the margin 7 of the insulating cover layer 4 is formed), the margin 7 of the insulating cover layer 4 is not situated in the position determining zone 13 on at least any of the four sides of the opening 8, either. Further, in the case of the insulating cover layer 4 formed of the synthetic resin film adhesively bonded via an adhesive, when the film laminated is displaced (to an excessive extent over the tolerance to the location where the margin 7 of the insulating cover layer 4 is formed), the margin 7 of the insulating cover layer 4 is not situated in the position determining zone 13 on at least any of the four sides of the opening 8, either. From the observation of this situation, it can be determined that the actual forming position of the opening 8 of the insulating cover layer 4 formed is displaced from the designed position of the opening 8, from which the wired circuit board 1 can be determined to be defective.

On the other hand, for example whenever the displacement of the margin 7 of the insulating cover layer 4 on every side of the opening 8 falls within the tolerance to the position of the margin 7 of the insulating cover layer 4, the margin 7 of the insulating cover layer 4 is situated in the position determining zone 13 (between the first reference line BL1 and the second reference line BL2), as shown in FIG. 1(a). Specifically, in this situation, an inner edge 15 of the first protrusion 9 of the pair of determining marks 14 can be observed, however, an outer edge 16 of the second protrusion 10 of the pair of the determining marks 14 cannot be observed. Accordingly, it can be detected from the observation of this situation that the actual position of the opening 8 of the insulating cover layer 4 formed is not displaced from the designed position of the opening 8, from which the wired circuit board 1 is determined to be non-defective.

When the wired circuit board 1 is determined to be defective, the insulating cover layer 4 covers the terminal portions 6 to hinder electrical connection between the terminal portions 6 and the external terminals 22 of the electronic component 21, so that the electronic component 21 cannot be mounted. Accordingly, the wired circuit board 1 having such an insulating cover layer 4 is eliminated as a defective product.

On the other hand, when the wired circuit board 1 is determined to be non-defective, since it is ensured the electrical connection between the terminal portions 6 and the external terminals 22 of the electronic component 21, the wired circuit board 1 is treated as a non-defective product. Then, the electronic component 21 is mounted on this wired circuit board 1 to electrically connect the external terminals 22 of the electronic component 21 to the terminal portions 6, as shown dotted line in FIG. 1(a). In addition, since the margin 7 of the insulating cover layer 4 is situated in a proper position, the wires 5 of the conductive pattern 3 can surely be covered and protected by the insulating cover layer 4 securely, so that corrosion and reduction in strength of the conductive pattern 3 of the wired circuit board 1 can be prevented effectively.

Further, in the production method of this wired circuit board 1, when the margin 7 of the insulating cover layer 4 is situated within the position determining zone 13, the wired circuit board 1 is determined to be non-defective, while on the other hand, when the margin 7 of the insulating cover layer 4 is not situated in the position determining zone 13, the wired circuit board 1 is determined to be defective. Hence, the defectiveness of the wired circuit board 1 can be easily determined by reference to the position determining zones 13. As a result, cost reduction can be achieved, while ensuring high productivity, by determining defectiveness of the wired circuit 1 in a reliable and simple manner.

In addition, in the production method of this wired circuit board 1, the conductive pattern 3 and the position determining zone 13 are formed simultaneously. Hence, the conductive pattern 3 and the position determining zone 13 can be formed easily. As a result, high productivity is ensured and the cost reduction can be achieved.

In the wired circuit board 1 thus obtained, the position determining zone 13 for determining whether or not the margin 7 of the insulating cover layer 4 facing the opening 8 is located in a proper position is provided in proximity of the terminal portions 6. This can allow easy determination whether or not the margin 7 of the insulating cover layer 4 is located in a proper position by reference to the position determining zone 13. This can provide a wired circuit board that can realize cost reduction by determining defectiveness of the wired circuit board 1 in a reliable and simple manner, while ensuring high productivity.

Further, the each position determining zone 13 is defined by a pair of determining marks 14 which are disposed opposite to each other in a direction orthogonal to a longitudinal direction of the wires 5 on outer sides (or in a direction along the margin 7 of the insulating cover layer 4) on each side of the opening 8 and are spaced apart by an amount to allow tolerance to a location where the margin 7 of the insulating cover layer 4 is formed. This can provide the position determining zone 13 with ease by a pair of determining marks 14.

Also, the pair of determining marks 14 are located outside of the wires 5 arranged at outermost sides of the direction along the margin 7 of the insulating cover layer 4. This can allow finer pitch of the space W2 between adjacent wires 5 so that the space therebetween can be set to a length specified above.

The pair of determining marks 14 are provided on each side of the opening 8 and formed to protrude outward from the wires 5 located at both outer sides (both outermost sides) of the direction along the margin 7 of the insulating cover layer 4. Further, the first protrusion 9 and the second protrusion 10 of the determining mark 14 are continuous with the wires 5 at the outermost sides of the conductive pattern 3. Therefore, when the conductive pattern 3 is formed by the electrolytic plating mentioned above, the conductive pattern 3 and the pair of determining marks 14 can be formed simultaneously by feeding electric power from common plating leads. As a result, the pair of determined marks 14 can be formed with ease.

Figure 4:
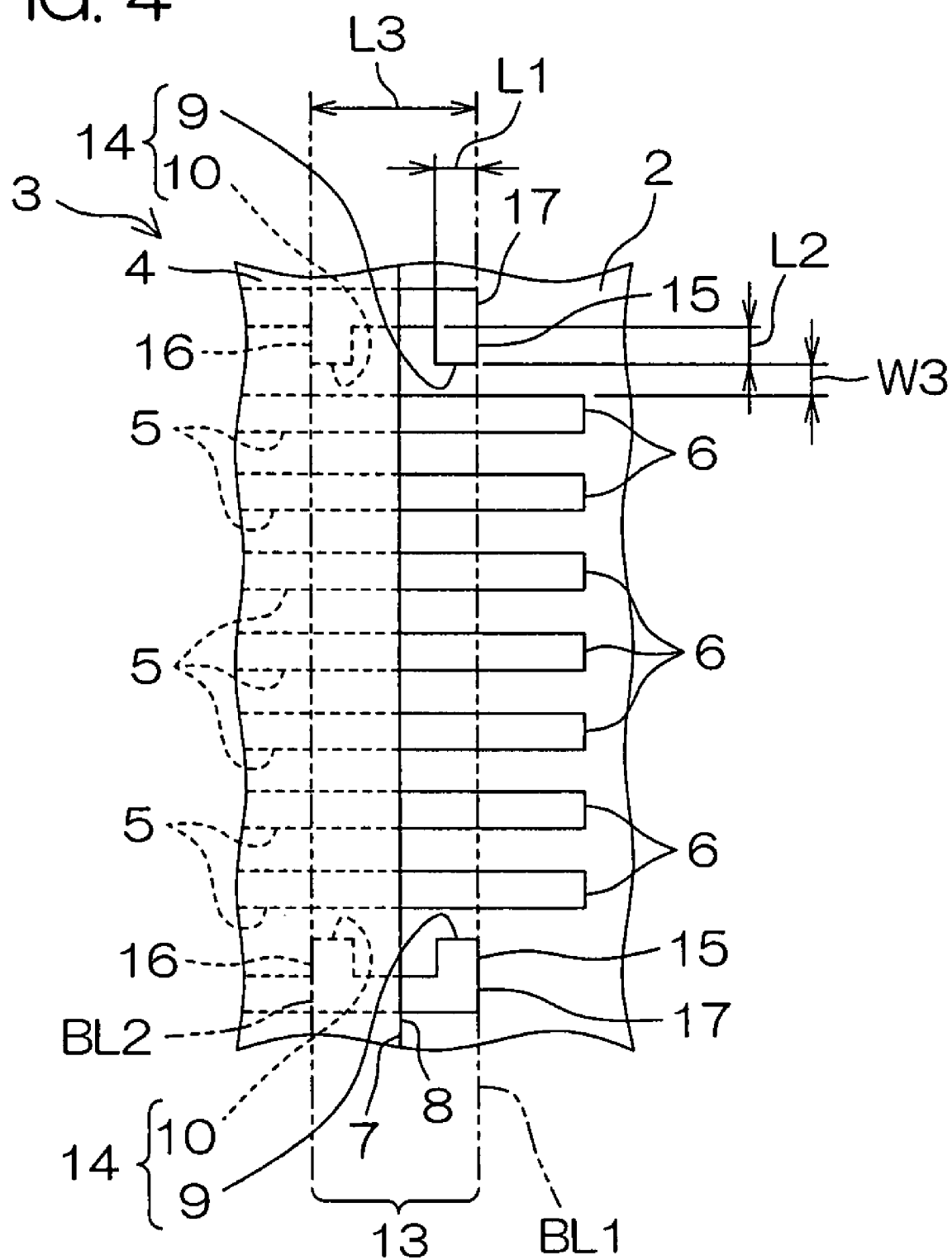
FIG. 4 is an enlarged plan view corresponding to FIG. 3, showing another embodiment of the pair of determining marks (determining marks in a square form, as viewed from top, formed on dedicated wires)

Although in the above illustration, the pair of determining marks 14 are formed on each side of the opening 8 in a manner that the first protrusion 9 and the second protrusion 10 are formed to continue to the wires 5 at outermost sides (both outer sides) of the direction along the margin 7 of the insulating cover layer 4, the pair of determining marks 14 can be formed, as shown in FIG. 4. Specifically, dedicated wires 17 extending in parallel with the wires 5 are formed outside of the respective wires 5 at the outermost sides (the both outer sides) of the direction along the margin 7 of the insulating cover layer 4, with spaced therefrom at a spaced interval of W3, so that the first protrusion 9 and the second protrusion 10 are formed to protrude continuously from those dedicated wires 17 in an inward direction with respect to the direction along the margin 7 of the insulating cover layer 4, as shown in FIG. 4.

The position determining zone 13 is defined as a strip-shaped zone along the margin 7 on each side of the opening 8 and sandwiched between the first reference line BL1 connecting between inner margins 15 of the respective first protrusions 9, and the second reference line BL2 connecting between outer margins 16 of the respective second protrusions 10.

Further, the determining mark 14 can be formed without providing any dedicated wires 17. For example, the determining mark 14 can be formed from the first protrusion 9 and the second protrusion 10 spaced apart at a spaced interval W3 from the respective wires 5 at the outermost sides of the direction along the margin 7 of the insulating cover layer 4, as shown in FIG. 5.

Figure 5:
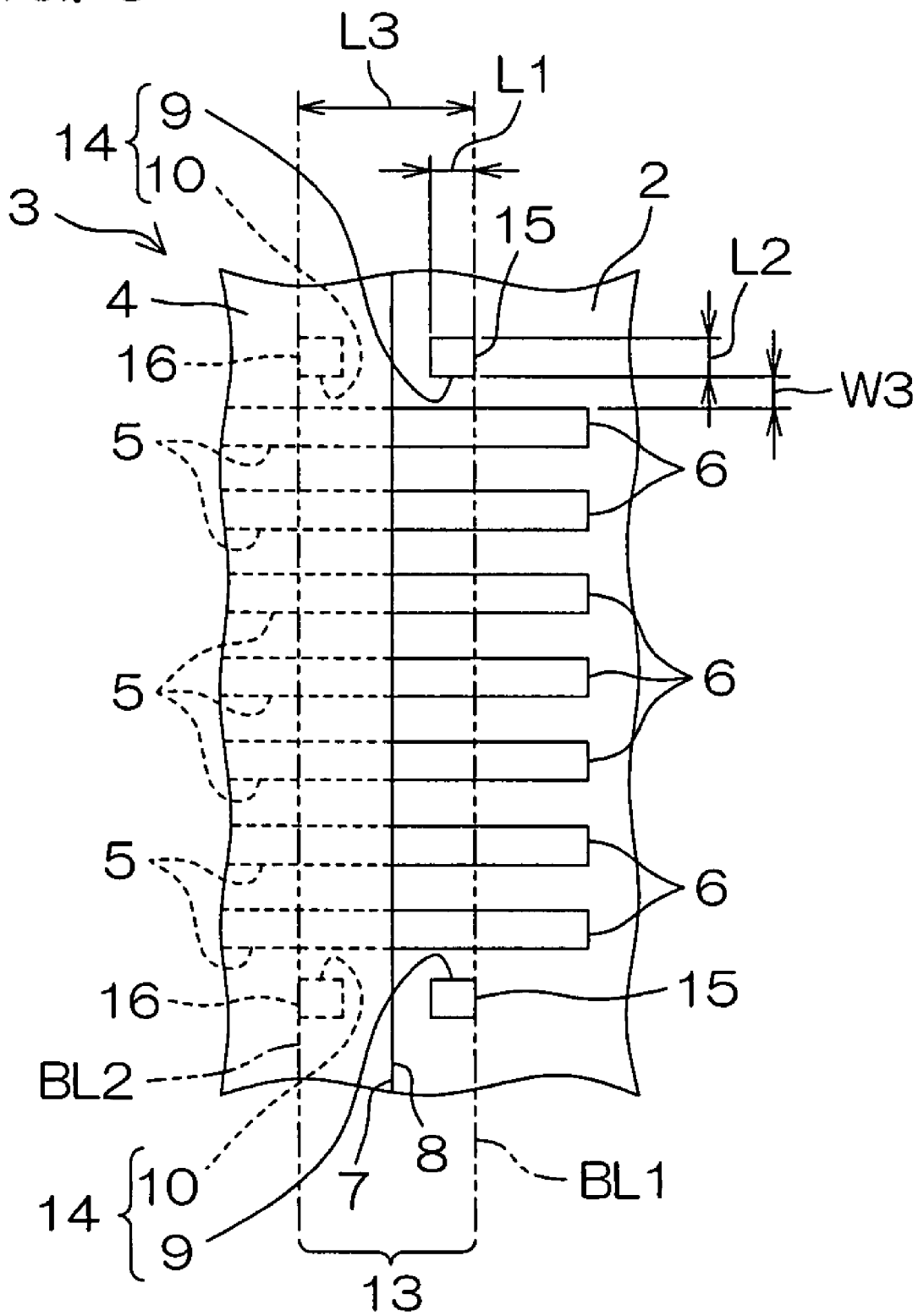
FIG. 5 is an enlarged plan view corresponding to FIG. 3, showing still another embodiment of the pair of determining marks (determining marks in a square form, as viewed from top, separated from the wires)

In this configuration of the determining mark 14, the first protrusion 9 and the second protrusion 10 are separated from each other and formed in a square form, as viewed from top, as shown in FIG. 5.

The space W3, shown in FIGS. 4 and 5, between the first protrusion 9 and second protrusion 10 of the determining mark 14 and the wires 5 at the outermost side of the direction along the margin 7 of the insulating cover layer 4 is set to e.g. 70 μm or less, or preferably 15-30 μm.

The position determining zone 13 is defined by the pair of determining marks 14 and formed as a strip-shaped zone along the margin 7 on each side of the opening 8 and sandwiched between the first reference line BL1 connecting between inner margins 15 of the respective first protrusions 9 and the second reference line BL2 connecting between outer margins 16 of the respective second protrusions 10.

Figure 6:
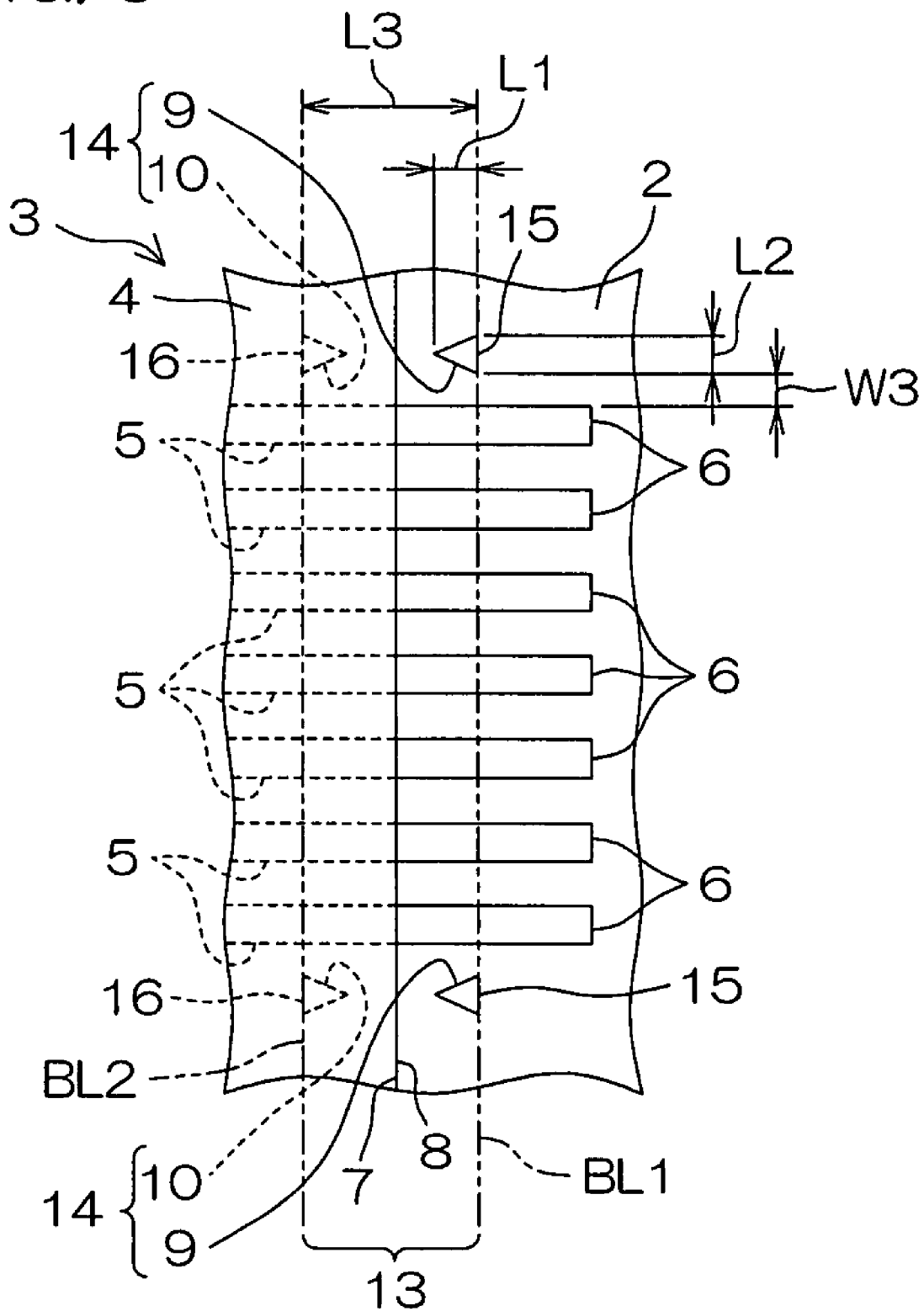
FIG. 6 is an enlarged plan view corresponding to FIG. 3, showing still another embodiment of the pair of determining marks (determining marks in a triangular form, as viewed from top, separated from the wires)
Figure 8:
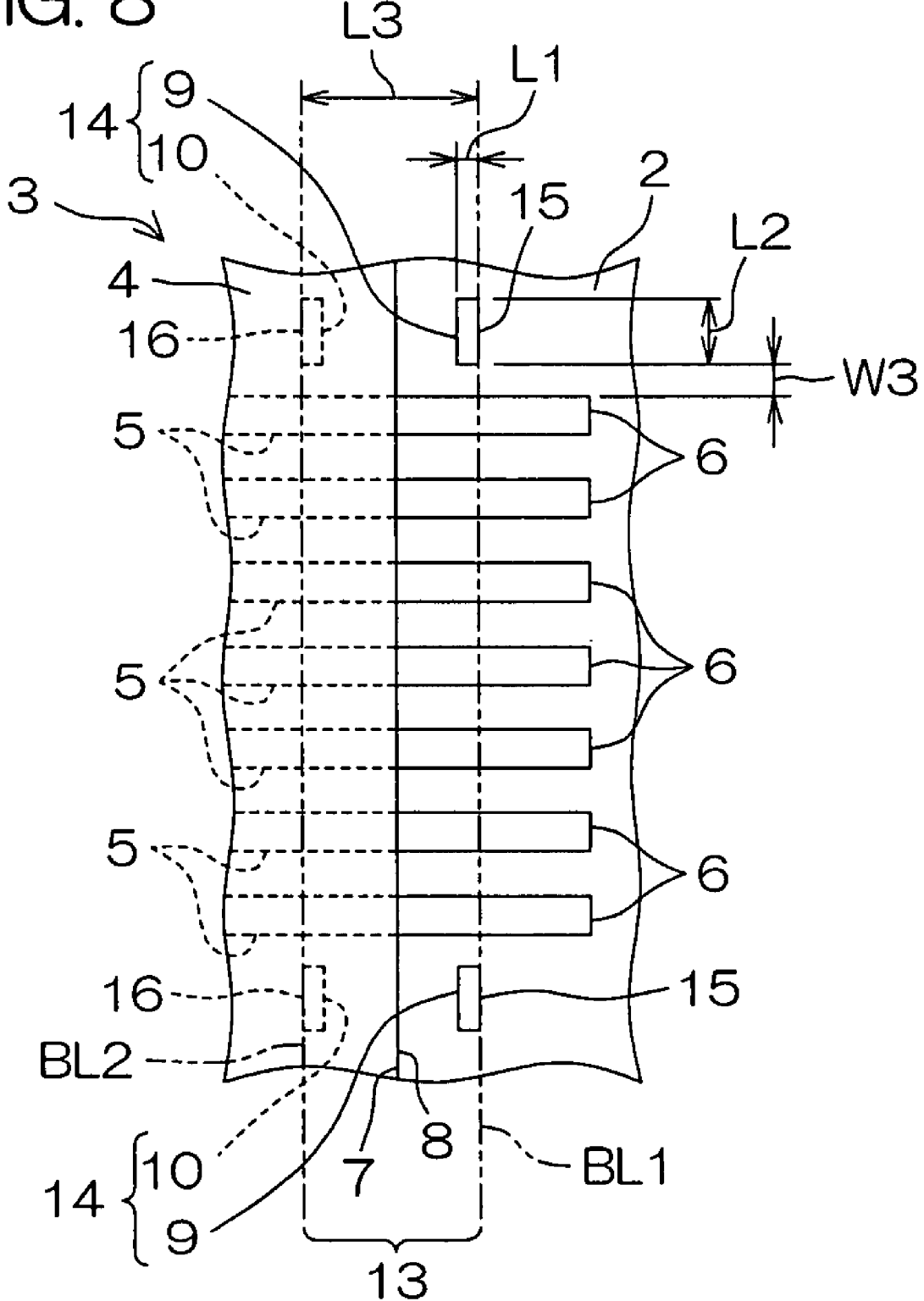
FIG. 8 is an enlarged plan view corresponding to FIG. 3, showing still another embodiment of the pair of determining marks (determining marks in a minus sign shape, as viewed from top, separated from the wires)
Figure 9:
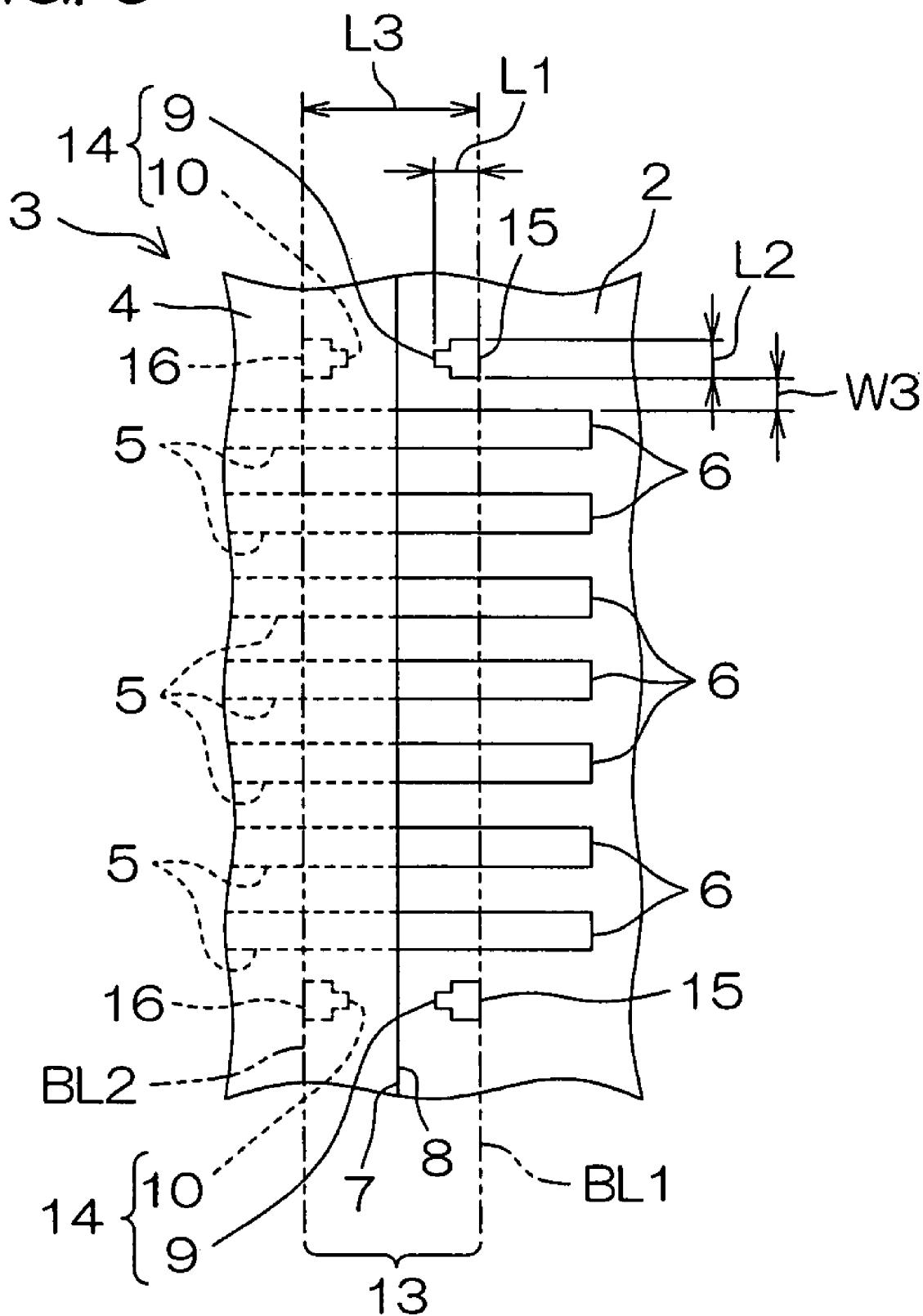
FIG. 9 is an enlarged plan view corresponding to FIG. 3, showing still another embodiment of the pair of determining marks (determining marks in a T shape extending along a longitudinal direction of the wire, as viewed from top, separated from the wires)
Figure 11:
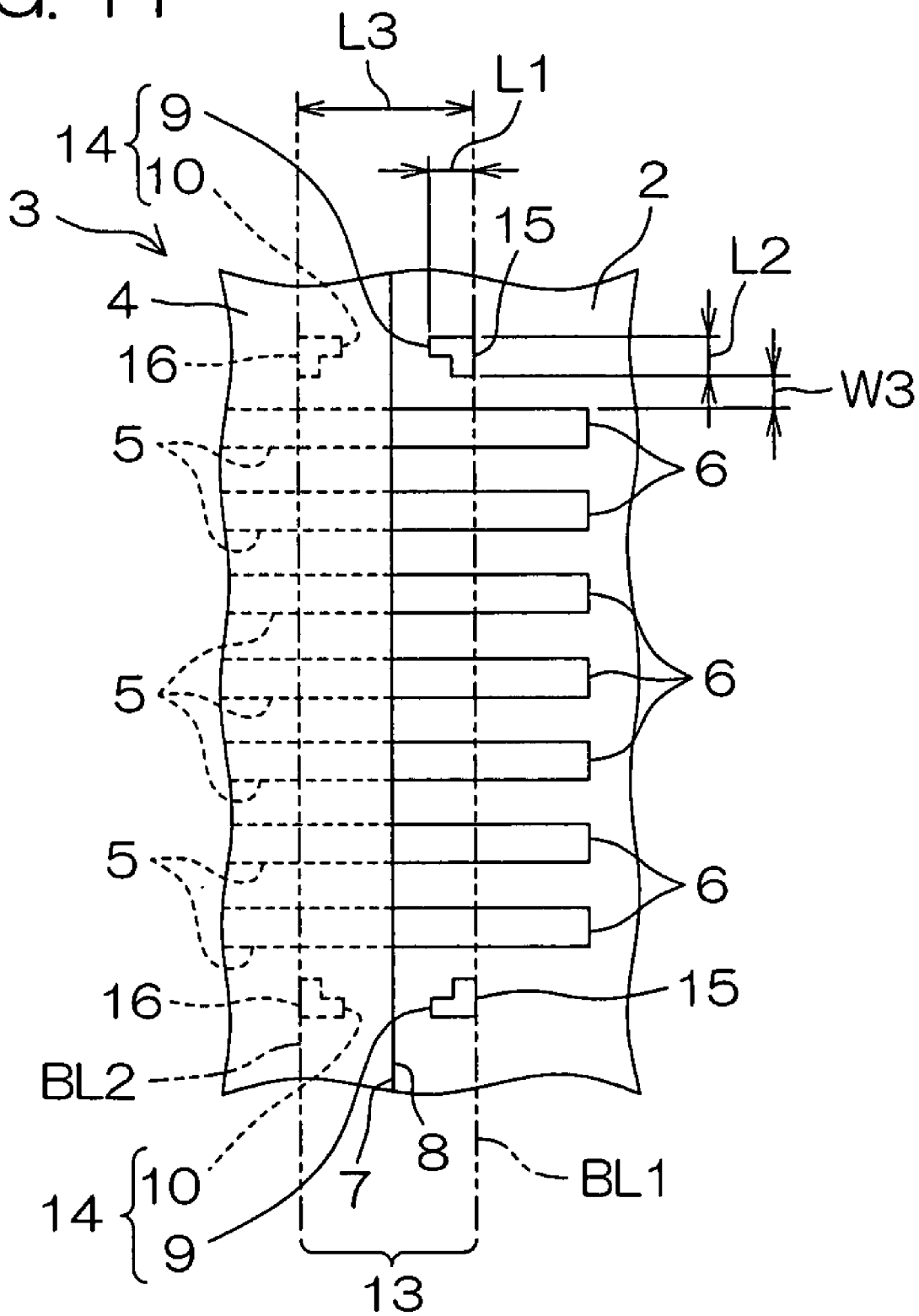
FIG. 11 is an enlarged plan view corresponding to FIG. 3, showing still another embodiment of the pair of determining marks (determining marks in an L-shape, as viewed from top, separated from the wires)
Figure 12:
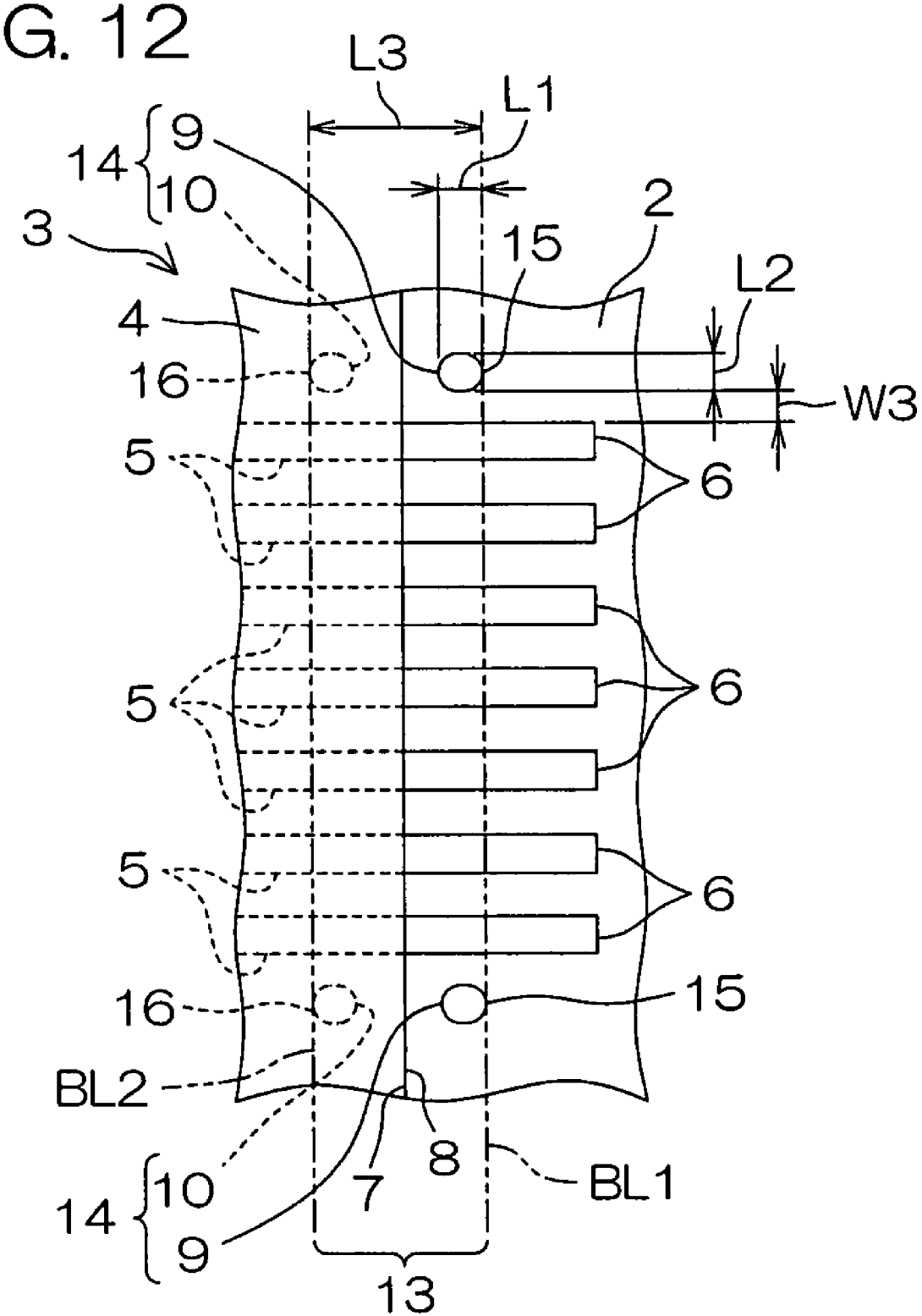
FIG. 12 is an enlarged plan view corresponding to FIG. 3, showing still another embodiment of the pair of determining marks (determining marks in a circular form, as viewed from top, separated from the wires)

Further, substituting for the square shape, as viewed from top, of the first protrusion 9 and second protrusion 10 of the determining mark 14 shown in FIG. 5, other planar shapes can be properly selected in accordance with intended purposes and applications. For example, a graphic shape or an alphabetical shape, a triangular shape (having an apex at a lengthwise inner direction of the wires 5; see FIG. 6), a plus sign shape (see FIG. 7), a minus sign shape (along the margin 7 of the insulating cover layer 4; see FIG. 8), a T-shape (along the longitudinal direction of the wires 5; see FIG. 9), a T-shape (along the margin 7 of the insulating cover layer 4; see FIG. 10), an L-shape (see FIG. 11), and a circular form (see FIG. 12), all of which are planer shapes, can be cited.

The each position determining zone 13 is defined by the pair of determining marks 14 on each side of the opening 8, as shown in FIGS. 5 to 12.

To be more specific, in FIGS. 5, 6, 8, 9, 11, and 12, the each position determining zone 13 is defined as a strip-shaped zone extended along the margin 7 on each side of the opening 8 and sandwiched between the first reference line BL1 connecting between two inner margins 15 of the respective first protrusions 9 and the second reference line BL2 connecting between outer margins 16 of the respective second protrusions 10.

Figure 7:
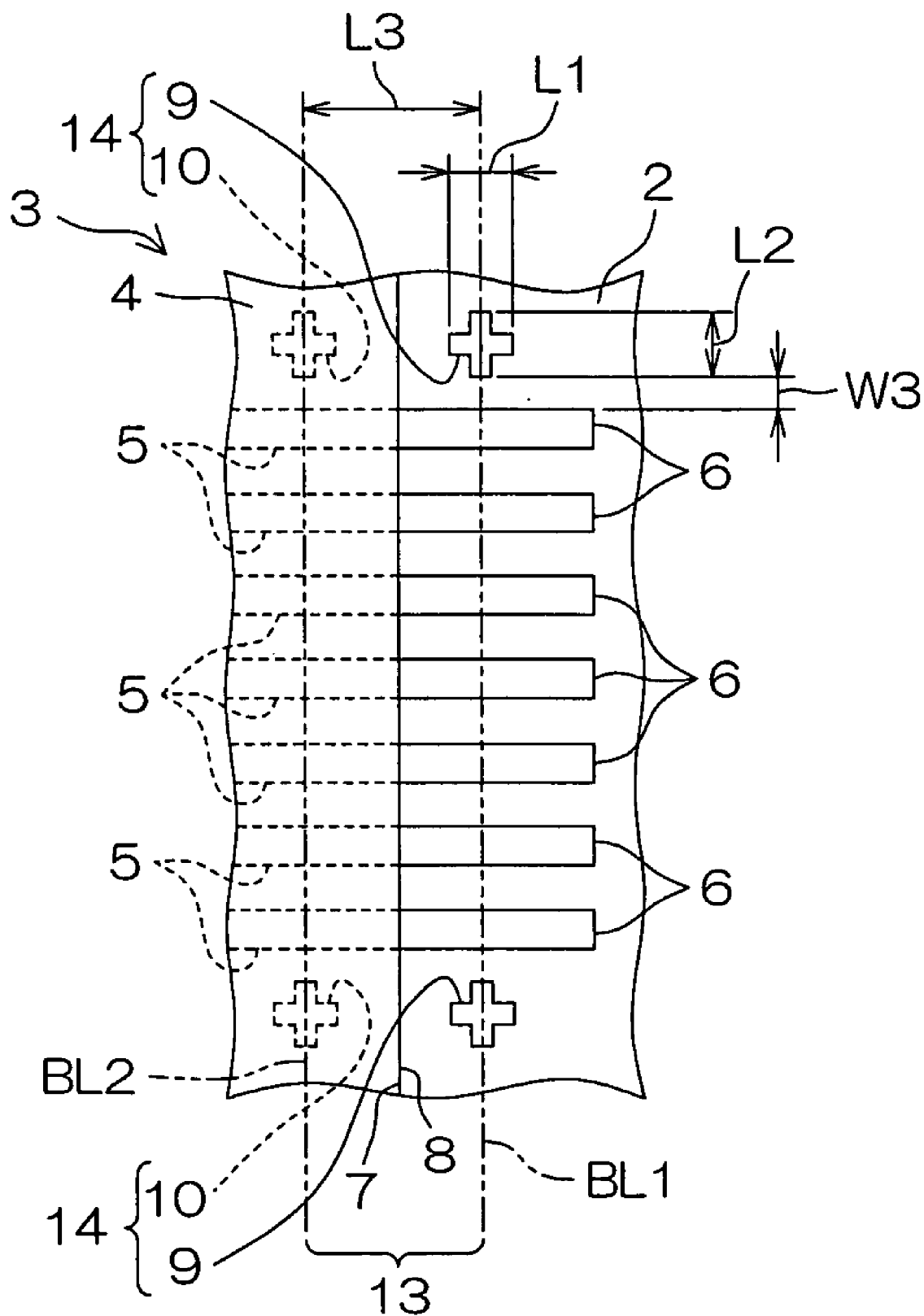
FIG. 7 is an enlarged plan view corresponding to FIG. 3, showing still another embodiment of the pair of determining marks (determining marks in a plus sign shape, as viewed from top, separated from the wires)
Figure 10:
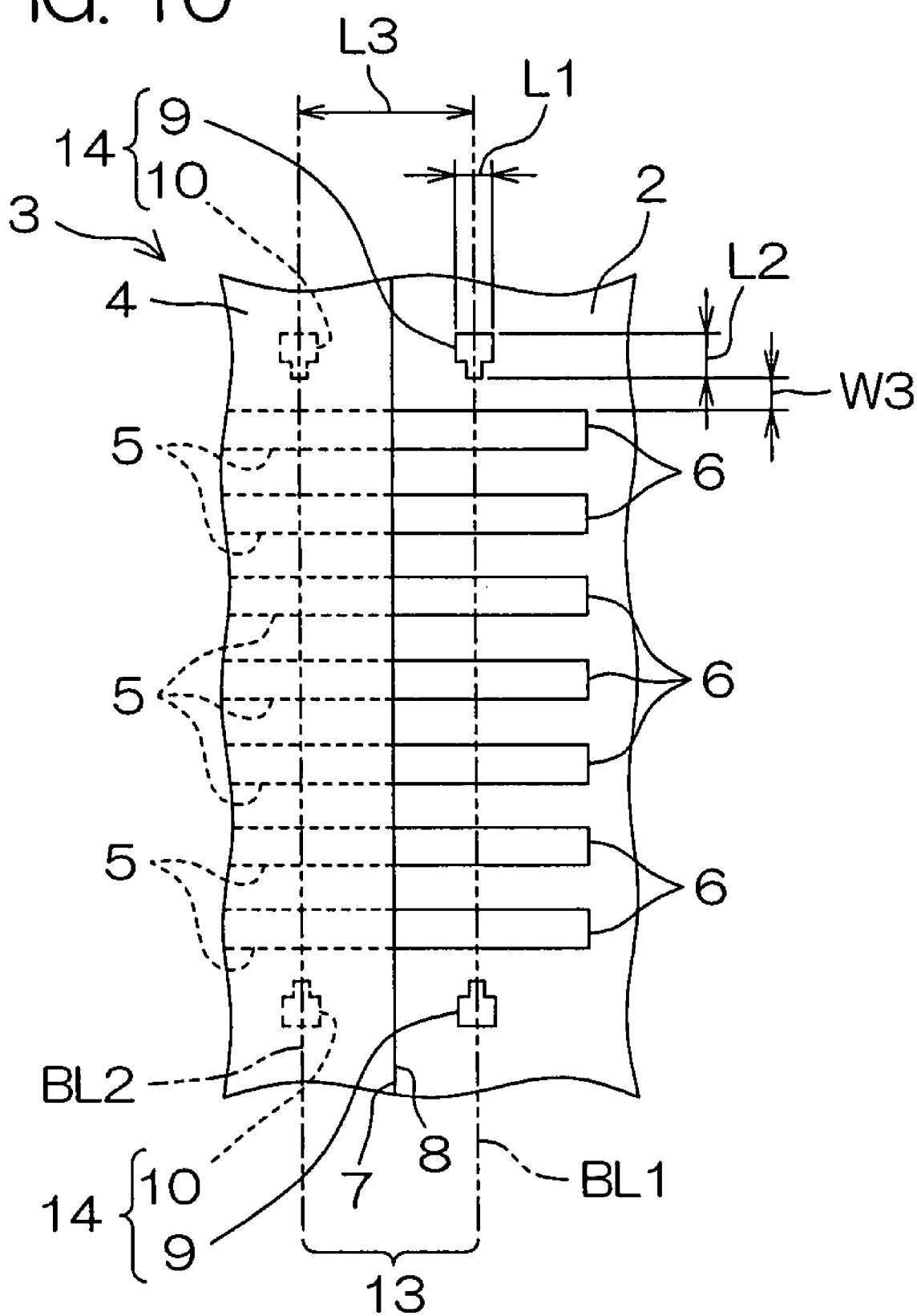
FIG. 10 is an enlarged plan view corresponding to FIG. 3, showing a still another embodiment of the pair of determining marks (determining marks in a T-shape extending along a margin of the insulating cover layer, as viewed from top, separated from the wires)

In FIGS. 7 and 10, the position determining zone 13 is defined as a strip-shaped zone along the margin 7 on each side of the opening 8 and sandwiched between the first reference line BL1 connecting between centers of the respective first protrusions 9 in the direction along the longitudinal direction of the wires 5 and the second reference line BL2 connecting between centers of the respective second protrusions 10 in the direction along the longitudinal direction of the wires 5.

Figure 13:
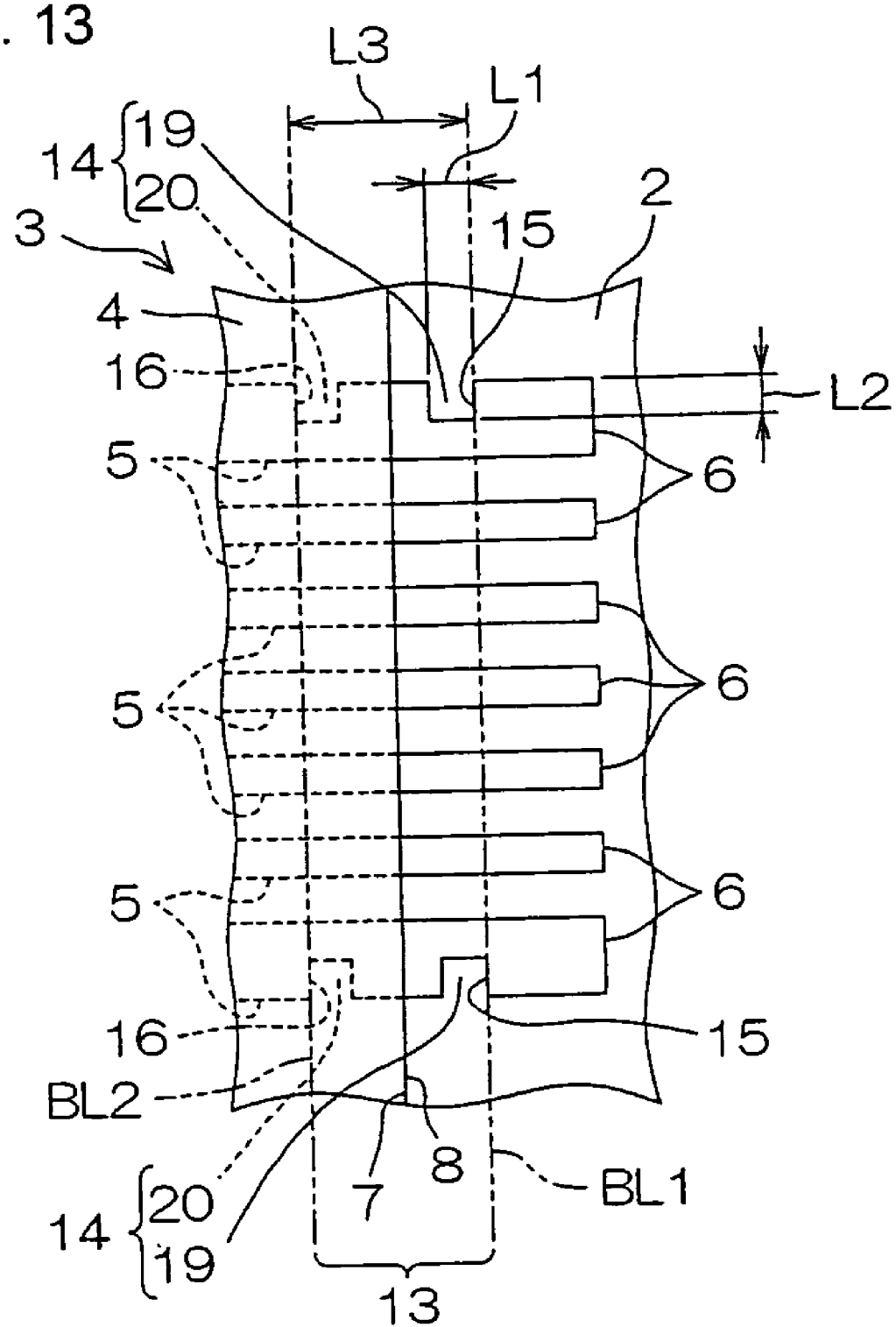
FIG. 13 is an enlarged plan view corresponding to FIG. 3, showing still another embodiment of the pair of determining marks (determining marks extending continuously with the wires and cut off in a square form as viewed from the top)

Further, as shown in FIG. 13, each determining mark 14 can alternatively be formed from a first recessed portion 19 and a second recessed portion 20, instead of the first protrusion 9 and the second protrusion 10.

The first recessed portion 19 and the second recessed portion 20 are formed by the respective wires 5 at the outermost sides of the direction along the margin 7 of the insulating cover layer 4 being notched inward in a square form, as viewed from top.

In FIG. 13, each position determining zone 13 is defined by the pair of determining marks 14 on each side of the opening 8.

To be more specific, the position determining zone 13 is defined as a strip-shaped zone along the margin 7 on each side of the opening 8 and sandwiched between the first reference line BL1 connecting between two inner margins 15 of the respective first recessed portions 19 and the second reference line BL2 connecting between outer margins 16 of the respective second recessed portions 20.

It is preferable that the determining mark 14 has a planar shape having a straight-line portion from which the first reference line BL1 and the second reference line BL2 can be clearly recognized, as shown in FIGS. 3 to 6, 8, 9, 11 and 13.

The determining mark 14 shown in FIGS. 4 to 13 has a length L1 (a part corresponding to the first protrusion 9 and the second protrusion 10 in FIG. 1(a)) along the longitudinal direction of the wires 5 and a length L2 along the margin 7 of the insulating cover layer 4. The length L1 is set to the range of e.g. 15-150 μm, or preferably 20-100 μm, and the length L2 is set to the range of e.g. 15-150 μm, or preferably 20-100 μm.

Although the pair of determining marks 14 are formed from the same metal as that of the conductive pattern 3 at the same time that the conductive pattern 3 is formed, no particular limitation is imposed on the formation of the determining marks 14 as far as the pair of determining marks 14 can serve as reference marks from which the proper position of the margin 7 of the insulating cover layer 4 for covering the terminal portions 6 can be determined by the observation. For example, the pair of determining marks 14 can be formed by the method that recess or through holes are formed in the insulating base layer 2 exposed from the opening 8 of the insulating cover layer 4 by using a laser or a mold tool.

Although in the above illustration, the pair of determining marks 14 are located outside of the wires 5 at the outermost sides (the both outer sides) of the direction along the margin 7 of the insulating cover layer 4, this location of the pair of determining marks 14 is not limited to the above. The pair of determining marks 14 can be located inside of the wires 5 at the outermost sides of the direction along the margin 7 of the insulating cover layer 4, which is not shown. Preferably, the pair of determining marks 14 are located outside of the wires 5 at the outermost sides of the direction along the margin 7 of the insulating cover layer 4 in terms of realization of finer pitch of the wires 5.

Although in the above illustration, the pair of determining marks 14 are arranged on the wires 5 at the both outermost sides of the direction along the margin 7 of the insulating cover layer 4, this arrangement of the pair of determining marks 14 is not limited to the above, either. A single determining mark 14 can be arranged on one of the wires 5 at the outermost sides of the direction along the margin 7 of the insulating cover layer 4, which is not shown. Preferably, the pair of determining marks 14 are arranged on the wires 5 at the both outermost sides of the direction along the margin 7 of the insulating cover layer 4.

Although in the above illustration, the position determining zone 13 is provided on each of the sides (four sides) of the opening 8, this layout of the position determining zone is not limited to the above, either. The position determining zone 13 can be provided on at least one of the four sides of the opening 8. Preferably, the position determining zone 13 is provided on each of the four sides of the opening 8.

While the illustrative embodiments of the present invention are provided in the aforesaid illustration, such is for illustrative purpose only and it is not to be construed limitative. Modification and variation of the present invention that will be obvious to those skilled in the art is covered by the following claims.

What is claimed is:

1. A wired circuit board comprising:
    an insulating base layer;
    a conductive pattern formed on the insulating base layer; and
    an insulating cover layer formed on the insulating base layer for covering the conductive pattern,
    wherein the conductive pattern includes terminal portions for connecting with external terminals;
    the insulating cover layer has an opening formed correspondingly for the respective terminal portions; and
    a position determining zone, for determining whether or not a margin of the insulating cover layer facing the opening is located in a proper position, is provided in the proximity of the terminal portions,
    wherein the position determining zone is formed to extend along a direction of the margin of the insulating cover layer, and
    wherein the position determining zone is defined by a pair of determining marks which are disposed opposite to each other in a direction intersecting with the direction along the margin of the insulating cover layer and are spaced apart by an amount to allow tolerance to an area where the margin of the insulating cover layer is formed.

2. The wired circuit board according to claim 1, wherein a plurality of terminal portions are arranged in parallel along the direction of the margin of the insulating cover layer, the conductive pattern includes wires extending from the terminal portions in the direction intersecting with the direction along the margin of the insulating cover layer correspondingly to the respective terminal portions, and
    wherein the determining marks are located outside of the wires arranged at outermost sides of the direction extending along the margin of the insulating cover layer.

3. The wired circuit board according to claim 2, wherein the determining marks are projected outward from the wires arranged at both outermost sides of the direction extending along the margin of the insulating cover layer.

4. A production method of a wired circuit board comprising the steps of:
    forming a conductive pattern including terminal portions for connecting with external terminals on an insulating base layer;
    forming an insulating cover layer on the insulating base layer to cover the conductive pattern so that an insulating cover layer is formed with an opening from which the terminal portions are exposed;
    forming a position determining zone for determining whether or not a margin of the insulating cover layer facing the opening is located in a proper position; and
    wherein in the step of determining whether or not the margin of the insulating cover layer is located in a proper position, when the margin of the insulating cover layer is within the position determining zone, the wired circuit board is determined to be non-defective, while when the margin of the insulating cover layer is out of the position determining zone, the wired circuit board is determined to be defective.

5. The production method of the wired circuit board according to claim 4, wherein in the steps of forming the conductive pattern and forming the position determining zone, the conductive pattern and the position determining zone are formed simultaneously.

* * * * *